US008819329B2

(12) United States Patent
Suto et al.

(10) Patent No.: US 8,819,329 B2
(45) Date of Patent: Aug. 26, 2014

(54) NONVOLATILE STORAGE DEVICE, ACCESS DEVICE AND NONVOLATILE STORAGE SYSTEM (75) Inventors: Masato Suto, Osaka (JP); Toshiyuki Honda, Kyoto (JP); Keizo Miyata, Osaka (JP)

(73) Assignee: Panasonic Corporation, Osaka (JP)

( * ) Notice: Subject to any disclaimer, the term of this patent is extended or adjusted under 35 U.S.C. 154(b) by 362 days.

(21) Appl. No.: 13/046,053

(22) Filed: Mar. 11, 2011

(65) Prior Publication Data

US 2011/0225381 A1   Sep. 15, 2011

(30) Foreign Application Priority Data

Mar. 12, 2010 (JP) ................................. 2010-055738

(51) Int. Cl.
*G06F 3/06* (2006.01)
*G11C 11/56* (2006.01)
*G06F 12/02* (2006.01)

(52) U.S. Cl.
CPC .... *G11C 11/5628* (2013.01); *G06F 2212/7205* (2013.01); *G06F 3/0652* (2013.01); *G06F 3/0619* (2013.01); *G06F 3/0679* (2013.01); *G06F 12/0246* (2013.01)
USPC .......................................... 711/103; 711/206

(58) Field of Classification Search
USPC .................................. 711/103, 206
See application file for complete search history.

(56) References Cited

U.S. PATENT DOCUMENTS

| 5,930,167 | A  | * | 7/1999 | Lee et al. ................. 365/185.03 |
| 2005/0122790 | A1 |   | 6/2005 | Ueno et al. |
| 2006/0129750 | A1 | * | 6/2006 | Lee et al. ....................... 711/103 |
| 2008/0168252 | A1 | * | 7/2008 | Kunimune et al. ........... 711/173 |
| 2008/0172521 | A1 | * | 7/2008 | Lee ................................. 711/103 |
| 2010/0122016 | A1 | * | 5/2010 | Marotta et al. ................ 711/103 |
| 2010/0174847 | A1 | * | 7/2010 | Paley et al. ................... 711/103 |

FOREIGN PATENT DOCUMENTS

| JP | 2006-323499 | 11/2006 |
| JP | 2007-257109 | 10/2007 |
| JP | 2009-211216 | 9/2009 |
| WO | 2004/066157 | 8/2004 |

* cited by examiner

*Primary Examiner* — Jared Rutz
(74) *Attorney, Agent, or Firm* — Wenderoth, Lind & Ponack, L.L.P.

(57) ABSTRACT

A memory controller includes a reading/writing control unit for controlling writing and reading of data to and from a physical block of a nonvolatile memory, a writing mode table for storing one of a first writing mode of protecting data against a power shutdown during writing and a second writing mode of writing data at a higher speed than the first writing mode, and a setting unit for setting the writing mode received from an access device in a writing mode table. The reading/writing control unit performs data writing based on the writing mode that has been set in the writing mode table.

7 Claims, 8 Drawing Sheets

| PHYSICAL BLOCK | STATUS |
|---|---|
| PB0 | UNUSED |
| PB1 | IN USE |
| PB2 | UNUSED |
| ⋮ | ⋮ |
| PB1023 | IN USE |

| WRITING MODE | HIGH SPEED |
|---|---|

| FIRST CELL PAGE | SECOND CELL PAGE |
|---|---|
| PP0 | PP4 |
| PP1 | PP5 |
| PP(4n+2) | PP(4n+8) |
| PP(4n+3) | PP(4n+9) |
| PP122 | PP126 |
| PP123 | PP127 |

FIG. 8

NONVOLATILE STORAGE DEVICE, ACCESS DEVICE AND NONVOLATILE STORAGE SYSTEM

BACKGROUND OF THE INVENTION

1. Field of the Invention

The present invention relates to a nonvolatile storage device, an access device for accessing the nonvolatile storage device, and a nonvolatile storage system comprising the foregoing nonvolatile storage device and access device, and in particular relates to a data writing method of the nonvolatile storage device using a nonvolatile semiconductor memory.

2. Description of the Related Art

A semiconductor memory card as a type of medium for recording digital data such as music contents and video contents uses a nonvolatile semiconductor memory such as a flash memory as its storage element.

In recent years, the extended capacity of flash memories is advancing, and high recording density and high data recording speed are becoming required. Moreover, in order to increase the recording capacity of a flash memory, a flash memory capable of recording multiple bits of data in one memory cell (hereinafter referred to as the "multilevel flash memory") is becoming widespread.

During the data writing of the foregoing multilevel flash memory, after data writing is performed to the lower bit among the plurality of bits, if a power shutdown occurs during the data writing to the higher bit, data that has been written into the lower bit become erroneous data in addition to the data of the higher bit that is currently being written. Thus, technologies for restoring data to the state before the power shutdown when certain data being subject to data writing is corrupted during a power shutdown of the multilevel flash memory, and effectively using the multilevel flash memory have been disclosed (for example, refer to Japanese Published Unexamined Patent Application No. 2007-257109 and Japanese Published Unexamined Patent Application No. 2009-211216).

Nevertheless, when constantly performing data writing which gives consideration to measures during a power shutdown, the processing time required for such data writing which gives consideration to measures during a power shutdown becomes enormous in comparison to the processing time required for data writing that does not give consideration to measures during a power shutdown.

Moreover, in cases of preliminarily writing and recording contents data such as maps and dictionaries in a nonvolatile storage device using a multilevel flash memory within a production plant and subsequently shipping this as a product, there are cases where it is desirable to shorten the writing time by writing data without giving consideration to measures during a power shutdown.

SUMMARY OF THE INVENTION

An object of this invention is to provide a nonvolatile storage device, an access device and a nonvolatile storage system which have a writing mode for realizing high-speed data writing separate from the writing mode performed against the power shutdown upon performing data writing to the nonvolatile storage device and which can shorten the writing time of contents data upon performing data writing to the nonvolatile storage device.

The nonvolatile storage device according to one aspect of the present invention is a nonvolatile storage device which is capable of communicating with an access device and performs writing and reading of data based on commands from the access device, comprising a nonvolatile memory in which the writing and reading of data are performed based on a physical address corresponding to a logical address and which is capable of multilevel writing, and a memory controller for controlling writing operation and reading operation of the nonvolatile memory, wherein the nonvolatile memory includes a plurality of blocks serving as an erase unit, wherein each of the plurality of blocks includes a plurality of pages serving as a write unit, wherein the memory controller includes a logical/physical conversion table storing correspondence information of a logical address and a physical address of data stored in the blocks, a control unit for specifying the physical address from the logical/physical conversion table based on the logical address received from the access device, and controlling the writing and reading of data to and from the blocks of the nonvolatile memory, a writing mode table for storing one of a first writing mode of protecting data against a power shutdown during writing and a second writing mode of writing data at a higher speed than the first writing mode, and a setting unit for setting the first writing mode or the second writing mode received from the access device in the writing mode table, and wherein the control unit performs data writing based on the writing mode that has been set in the writing mode table.

According to the foregoing configuration, the writing time of contents data can be shortened by using the second writing mode for realizing high-speed data writing separated from the first writing mode performed against power shutdown upon performing data writing to the nonvolatile storage device.

These and other objects, features and advantages of the present invention will become more apparent upon reading the following detailed description along with the accompanying drawings.

DETAILED DESCRIPTION OF THE INVENTION

A nonvolatile memory system according to an embodiment of the present invention is now explained with reference to the appended drawings.

Figure 1:
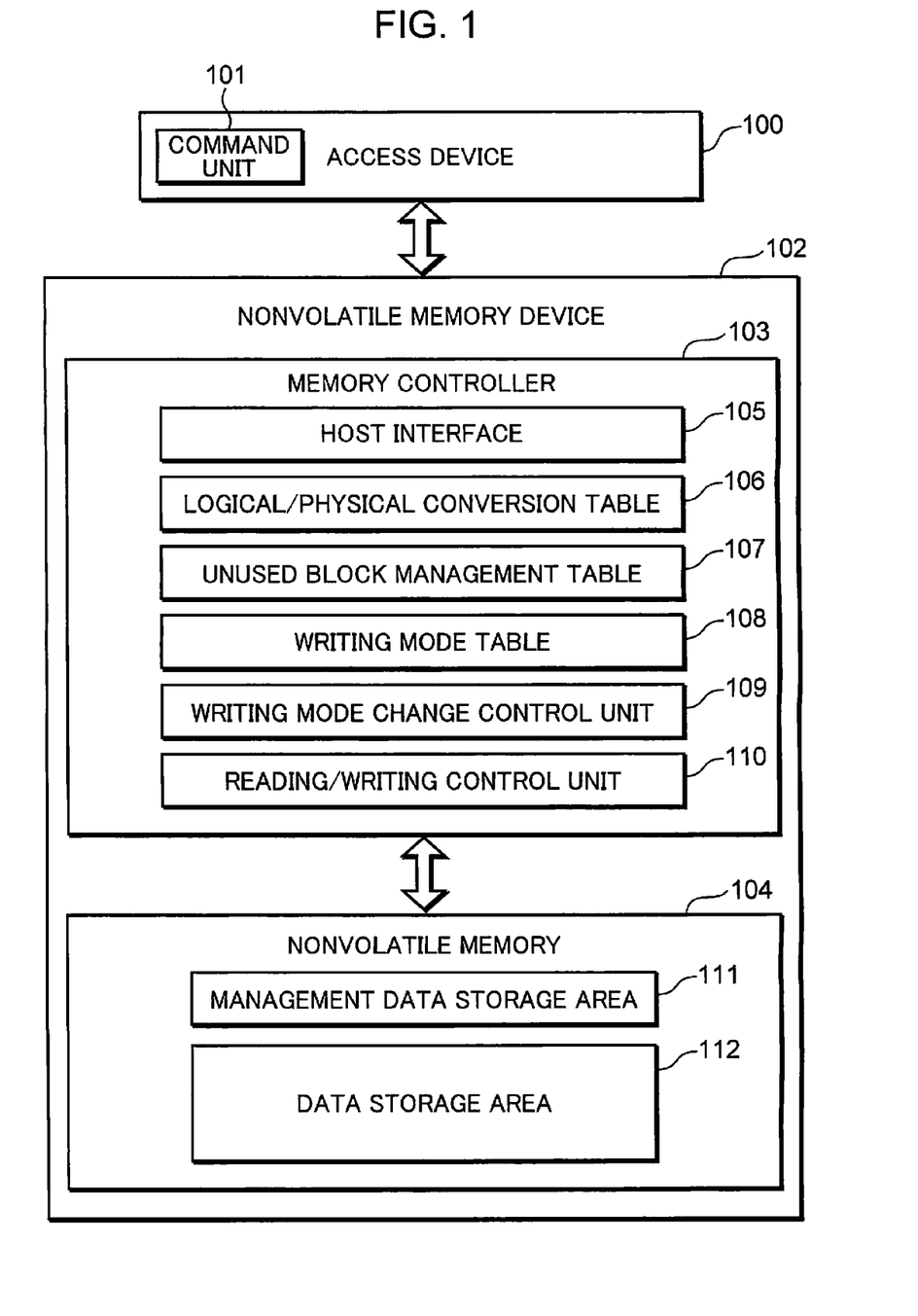
FIG. 1 is a block diagram showing a configuration of the nonvolatile memory system according to an embodiment of the present invention.

FIG. 1 is a block diagram showing a configuration of the nonvolatile memory system according to an embodiment of the present invention. The nonvolatile memory system shown in FIG. 1 is an example of a nonvolatile storage system, and includes an access device 100, and a nonvolatile memory device 102. The nonvolatile memory device 102 can communicate with the access device 100, and performs the writing and reading of data according to commands from the access device 100. The nonvolatile memory device 102 is, for example, a semiconductor memory card as an example of a nonvolatile storage device. The access device 100 is a host device that writes and reads data to and from the nonvolatile memory device 102, and is, for example, a digital camera, mobile phone, video recorder, computer or the like.

The access device 100 comprises a control unit (not shown) for performing various types of control of the access device 100, a command unit 101 for transmitting commands and data to and from the nonvolatile memory device 102 and the like. The command unit 101 sends various commands to the nonvolatile memory device 102 under the control of the control unit, and, for example, sends to the nonvolatile memory device 102 a write command for instructing data writing and a writing mode change command for instructing the change of the writing mode.

The nonvolatile memory device 102 includes a memory controller 103 and a nonvolatile memory 104. The memory controller 103 is a semiconductor circuit that receives commands from the access device 100 and controls the writing and reading of data to and from the nonvolatile memory 104. The nonvolatile memory 104 is a flash memory capable of retaining data without requiring power.

The memory controller 103 includes a host interface 105, a logical/physical conversion table 106, an unused block management table 107, a writing mode table 108, a writing mode change control unit 109, and a reading/writing control unit 110.

The host interface 105 exchanges commands and data with the access device 100. The logical/physical conversion table 106 is a table for converting the logical address designated by the access device 100 into a physical address within the nonvolatile memory 104, and stores correspondence information of the logical address and physical address of the data stored in a physical block of the nonvolatile memory 104.

The unused block management table 107 is a table for managing the usage of the physical blocks in the nonvolatile memory 104. The writing mode table 108 is a table for managing information that is used for determining the writing method, and stores one of an anti-power shutdown mode as a first writing mode for protecting data against a power shutdown during writing, and a high-speed mode as an example of a second writing mode of writing data a higher speed than the first writing mode.

The writing mode change control unit 109 controls the change of the writing mode based on the writing mode change command acquired from the command unit 101 of the access device 100, and sets the anti-power shutdown mode or the high-speed mode received from the access device 100 in the writing mode table 108. The reading/writing control unit 110 controls the writing and reading of data to and from the nonvolatile memory 104, and performs data writing based on the writing mode that has been set in the writing mode table 108. Note that the respective blocks described above are mutually connected via a wiring not shown, and configured to be able to mutually communicate various types of data, signals and the like.

The nonvolatile memory 104 is a nonvolatile semiconductor memory in which the writing and reading of data are performed based on a physical address corresponding to a logical address and which is capable of multilevel writing, and includes a plurality of blocks. Each of the blocks serves as an erase unit. Each of the plurality of blocks includes a plurality of pages and each of the pages serves as a write unit. For example, the nonvolatile memory 104 is a multilevel NAND-type flash memory including a plurality of physical blocks and each of the physical blocks becomes a data erase unit.

Specifically, the nonvolatile memory 104 includes a plurality of memory cells with M-number of (M>3, wherein M is an integer) threshold voltage regions, a physical page is configured from a plurality of memory cells as a data write unit, and a physical block is configured from a plurality of physical pages serving as a data erase unit. With the nonvolatile memory 104, data can be written based on either single level mode writing of writing data using two threshold voltage regions among the M-number of threshold voltage regions, or multilevel mode writing of writing data using M-number of threshold voltage regions.

Moreover, the nonvolatile memory 104 includes a management data storage area 111, and a data storage area 112. The management data storage area 111 is an area that cannot be accessed from the access device 100, and address management information and the like are stored therein. The data storage area 112 is an area where writing and reading can be performed from the access device 100 by designating a logical address, and contents data and file system data are stored therein.

Figure 2:
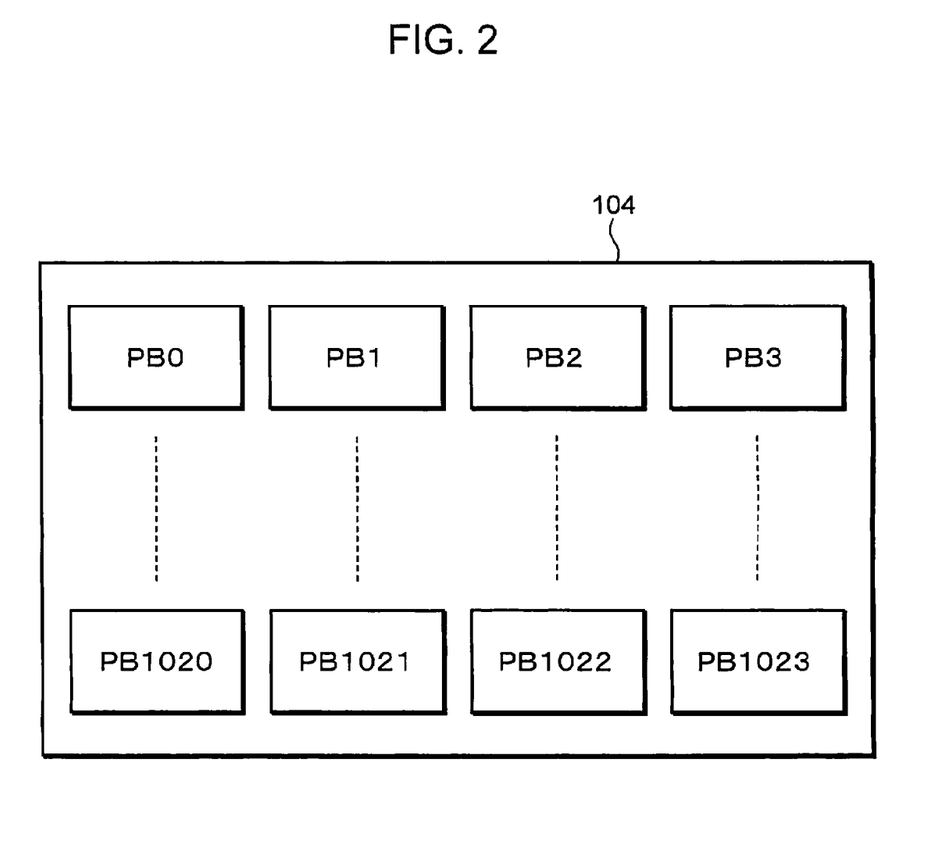
FIG. 2 is a schematic diagram explaining an example of the internal structure of the nonvolatile memory shown in FIG. 1.

FIG. 2 is a schematic diagram explaining an example of the internal structure of the nonvolatile memory 104. The nonvolatile memory 104 is configured, for example, from 1024 physical blocks numbered PB0 to PB1023. A physical block is an erase unit of the nonvolatile memory 104, and, for example, the capacity per physical block is 512 KB (kilobytes).

Figure 3:
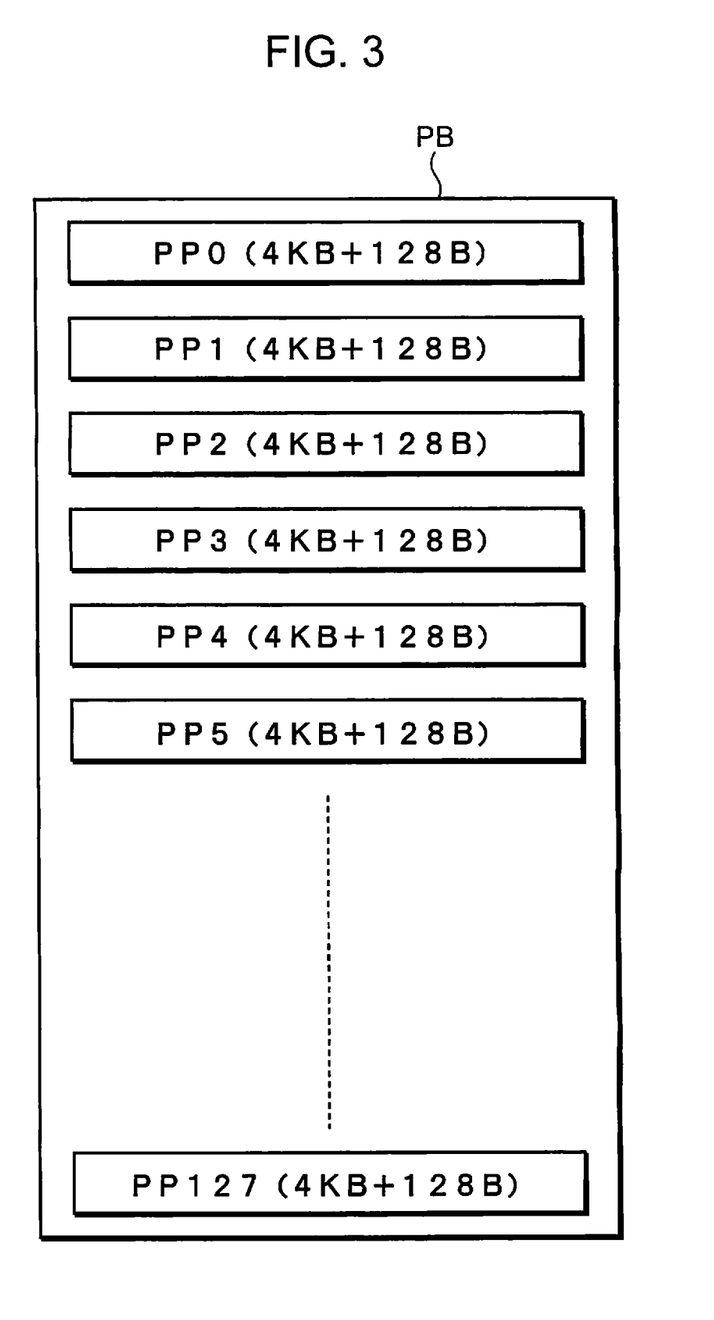
FIG. 3 is a schematic diagram explaining an example of the internal structure of the physical block of the nonvolatile memory shown in FIG. 1.

FIG. 3 is a schematic diagram explaining an example of the internal structure of one physical block. A physical block PB is configured, for example, from 128 physical pages numbered PP0 to PP127. A physical page is the minimum unit for writing data in the nonvolatile memory 104. When writing data, data is written in order from a physical page with the smallest number. The capacity per physical page is, for example, a value obtained by adding 4 KB as the capacity for storing data, and 128 B as the capacity for storing management information.

Figure 4:
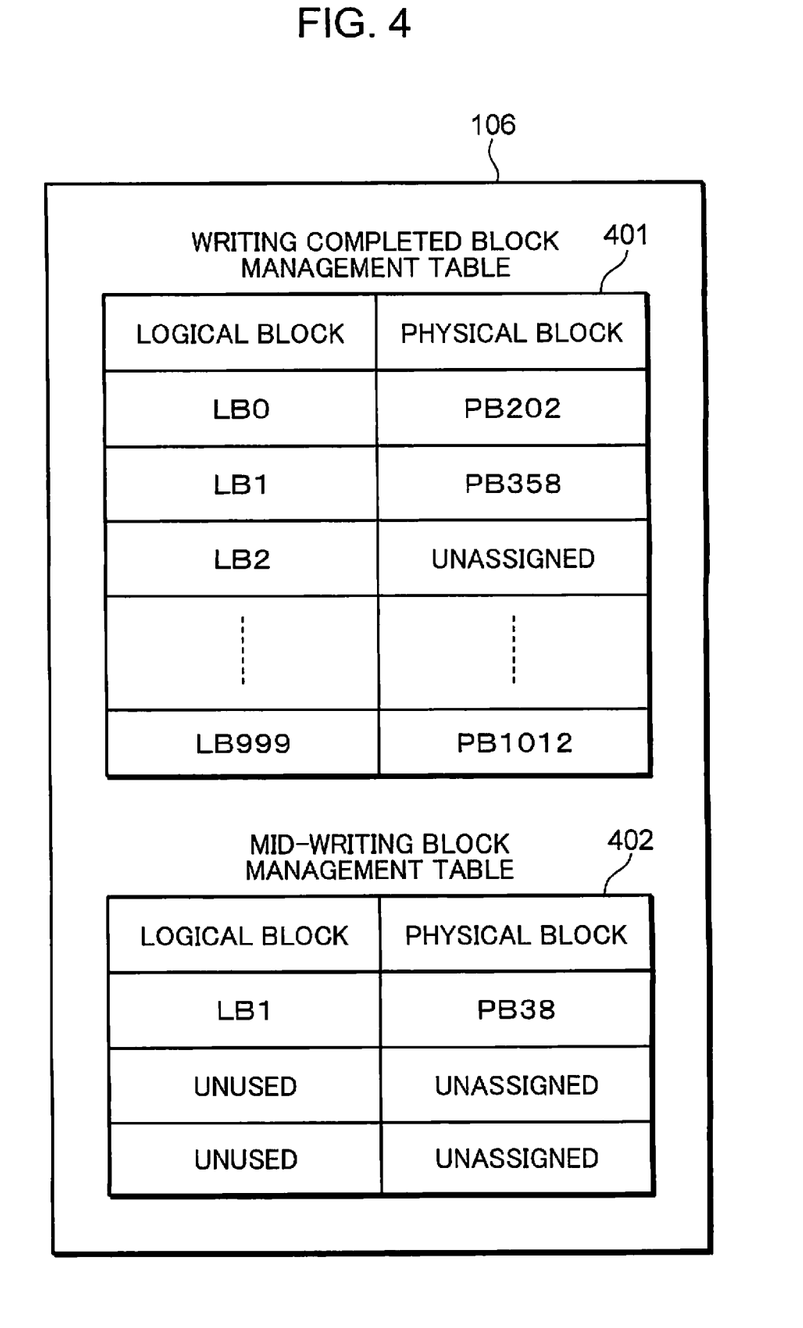
FIG. 4 is a diagram showing an example of the configuration of the logical/physical conversion table shown in FIG. 1.

FIG. 4 is a diagram showing an example of the configuration of the logical/physical conversion table 106. Logical/physical conversion is the processing of converting the logical address of the logical block (LB) obtained from the logical address designated by the access device 100 into a physical address of the physical block (PB) of the nonvolatile memory 104.

The logical/physical conversion table 106 is a table that stores the logical address of the logical block by associating it with the physical address of the physical block to be converted. The reading/writing control unit 110 specifies the physical address including the logical address designating the write destination page from the logical/physical conversion table 106 in response to the logical address designating the write destination page received from the access device 100, and thereby controls the writing operation and reading operation of the nonvolatile memory 104.

The logical/physical conversion table 106 is configured from a writing completed block management table 401, and a mid-writing block management table 402.

The writing completed block management table 401 is a table that manages the physical address of a writing completed block, which is a physical block in which data is written in all physical pages within the physical block, by associating it with the logical address of the logical block. A value showing "unassigned" is set, as the physical address, to a logical address of a logical block to which a physical block is not assigned.

The mid-writing block management table 402 is a table that manages the physical address of a mid writing block, which is a physical block in which data is not written in all physical pages within the physical block, by associating it with the logical address of the logical block.

In the example shown in FIG. 4, the logical block LB1 (logical block with the logical address LB1) corresponds to two physical blocks PB358, PB38 (physical block with the physical address PB358 and physical block with the physical address PB38). The physical block PB358 is indicated as being a writing completed block, but the physical block PB38 is shown as a mid-writing block. This means that data of a logical block that is the same as the data of the physical block PB358 is written in the physical block PB38. As described above, two physical blocks; namely, one writing completed block and one mid-writing block, can be associated with one logical block.

A physical block in which its physical address is registered in the mid-writing block management table 402 is used as a write block for newly writing data, and, for example, physical addresses of up to three physical blocks can be registered. If the number of registered physical addresses of the physical blocks is less than the maximum value, a value showing "unused" is set as the logical address of the logical block of the unused area, and a value showing "unassigned" is set as the physical address.

Upon newly writing data, if three sets of a logical address of a logical block and a physical address of a physical block are registered as mid-writing blocks, the reading/writing control unit 110 performs multilevel mode aggregation described later to one of such sets and causes that physical block to be a writing completed block. The reading/writing control unit 110 thereafter registers the set of the logical address of the logical block and the physical address of the writing completed block in the writing completed block management table 401, and deletes that set from the mid-writing block management table 402. Subsequently, the reading/writing control unit 110 newly registers a logical address of a logical block and a physical address of a physical block in the area that is now unused due to the foregoing deletion.

Figure 5:
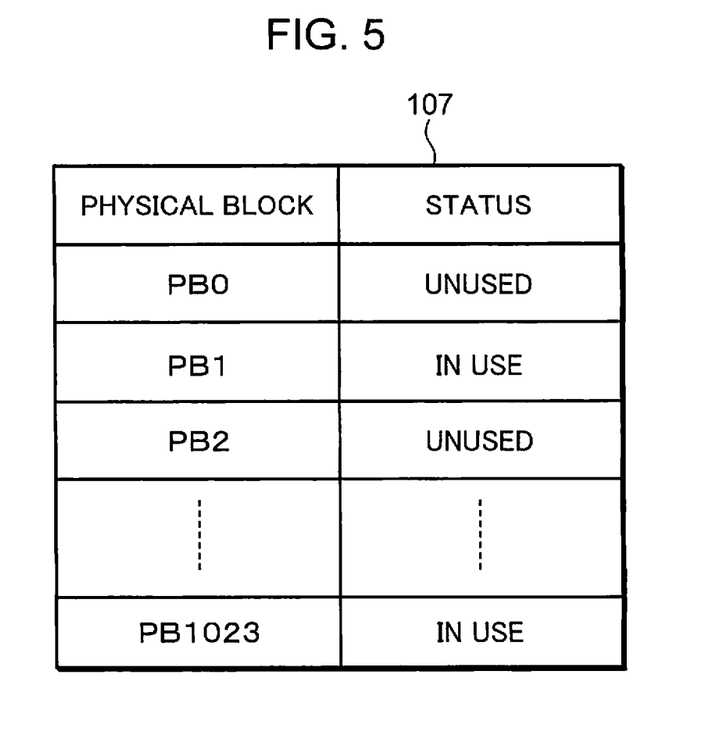
FIG. 5 is a diagram showing an example of the configuration of the unused block management table shown in FIG. 1.

FIG. 5 is a diagram showing an example of the configuration of the unused block management table 107. The unused block management table 107 is a table showing whether each of the physical blocks is an "in use" block that is being used as a writing completed block or a mid-writing block, or an "unused" block that is not being used.

In FIG. 5, the "physical block" column stores the physical addresses (PB0 to PB1023) of the physical blocks, and the "status" column stores "in use" or "unused". "In use" shows that the physical block is being used as a writing completed block or a mid-writing block, and "unused" shows that the physical block is an unused block that is not being used. The reading/writing control unit 110 refers to the unused block management table 107 upon writing data, acquires the physical address of a physical block that is "unused," and writes data into that physical block.

Figure 6:
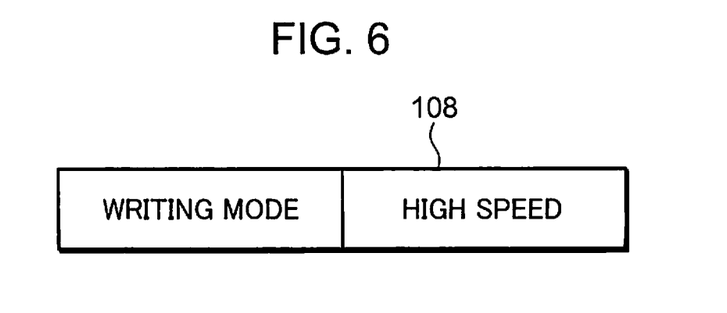
FIG. 6 is a diagram showing an example of the configuration of the writing mode table shown in FIG. 1.

FIG. 6 is a diagram showing an example of the configuration of the writing mode table 108. The writing mode table 108 stores the writing mode as information for determining the writing method. There are two types of writing modes; namely, a high-speed mode and an anti-power shutdown mode. "High-speed" shows the high-speed mode of using multilevel mode writing capable of writing data in a short period of time, and "anti-power shutdown" shows the anti-power shutdown mode for protecting data against a power shutdown during writing. The anti-power shutdown mode uses single level mode writing capable of reducing the amount of data that is corrupted during a power shutdown during writing, and multilevel mode aggregation. The writing mode is set as the anti-power shutdown mode when the power is turned ON. The writing mode can thereafter be changed based on a command from the command unit 101 of the access device 100.

Figure 7:
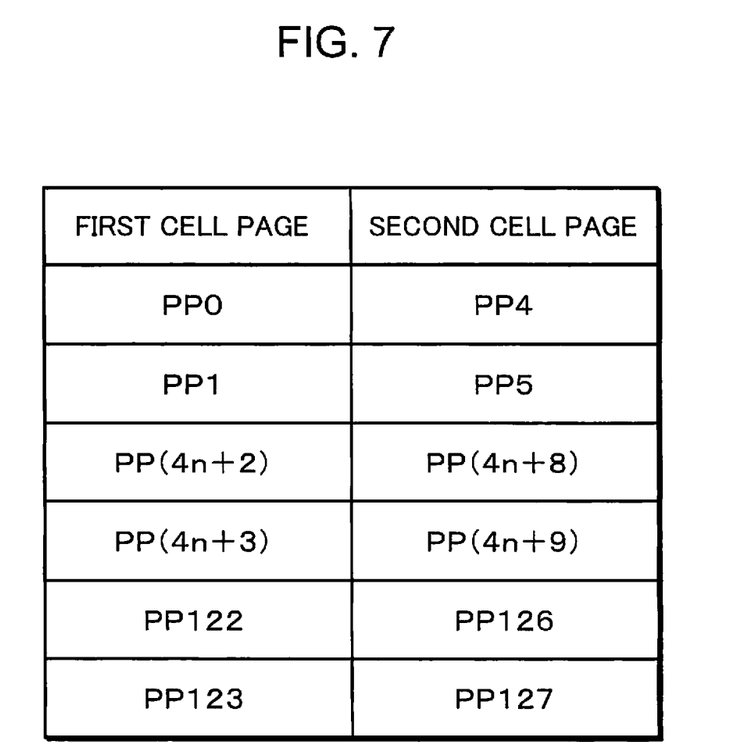
FIG. 7 is a diagram showing an example of a cell page to which belongs the physical page of the nonvolatile memory shown in FIG. 1.

FIG. 7 is a diagram showing an example of the physical pages belonging to a first cell page and a second cell page in a multilevel NAND-type flash memory. The multilevel NAND-type flash memory that is used as the nonvolatile memory 104 records, for example, a 2-bit value in one memory cell. Since these two bits are assigned to two physical pages, the two physical pages share a memory cell. FIG. 7 shows the pair of physical pages sharing a memory cell.

For example, the physical page PP0 and the physical page PP4 are sharing a memory cell. Thus, the first bit of the physical page PP0 and the first bit of the physical page PP4 are stored in the same memory cell. As described above, of the two physical pages sharing a memory cell, the physical page with a smaller number is the first cell page, and the physical page with a larger number is the second cell page. Note that, in FIG. 7, n is an integer that satisfies the inequality $0 \leq n \leq 29$.

The two types of writing methods; namely, the data writing methods that are processed with the high-speed mode and the anti-power shutdown mode, is now explained. The data writing based on the anti-power shutdown mode is explained first.
[Data that is Corrupted Due to a Power Shutdown]

When the power of the nonvolatile memory device 102 is shut down during the writing of data, data of the physical page sharing a memory cell with the physical page being written becomes corrupted. For example, in the example shown in FIG. 7, when the power is shut down while data is being written into the physical page PP5, data of the physical page PP1 sharing a memory cell becomes corrupted.
[Single Level Mode Writing]

In order to prevent the corruption of data when power is shut down during the writing of data, the reading/writing control unit 110 performs single level mode writing. The single level mode writing is the method of writing data only in physical pages belonging to the first cell page, and data is not written in physical pages belonging to the second cell page. Thus, there are no physical pages that become corrupted due to a power shutdown. Nevertheless, since data is written in only half of the physical block capacity in single level mode writing, at the point in time that data is written into the physical pages belonging to the first cell page, that physical block cannot be deemed a writing completed block. Thus, in the anti-power shutdown mode, the reading/writing control unit 110 creates a writing completed block by implementing the multilevel mode aggregation described later after performing single level mode writing to the physical pages belonging to the first cell page.
[Multilevel Mode Aggregation]

Multilevel mode aggregation is the processing of reading data from a writing completed block and a mid-writing block, and copying such data to all physical pages in an unused block in order to create a writing completed block. The reading/writing control unit 110 implements the foregoing multilevel mode aggregation. Here, if a power shutdown occurs during the multilevel mode aggregation, data corruption caused by the power shutdown is prevented by abandoning the data written in the writing completed block that is being created when the power is restored. As described above, as a result of concurrently using the single level mode writing and the multilevel mode aggregation, it is possible to realize writing capable of preventing the data corruption caused by a power shutdown.

Note that, when implementing the multilevel mode aggregation of a logical block that does not contain a writing completed block, the default value (all bits 1) is written in substitute for copying data of the writing completed block.

The data writing based on the high-speed mode is now explained.

[Multilevel Mode Writing]

The single level mode writing and the multilevel mode aggregation are effective for preventing the data corruption caused by a power shutdown, but writing of data in the physical pages must be performed a plurality of times in order to write one page worth of data. In cases where there is no possibility of a power shutdown such as during factory production, multilevel mode writing capable of writing one page worth of data by writing data in the physical page once is effective. Thus, in the high-speed mode, the reading/writing control unit 110 implements the foregoing multilevel mode writing. When implementing the multilevel mode writing, the reading/writing control unit 110 writes data in all physical pages in the physical block. At the point in time that data is written in all physical pages, the mid-writing block becomes a writing completed block.

[Routine of Data Writing Processing]

Figure 8:
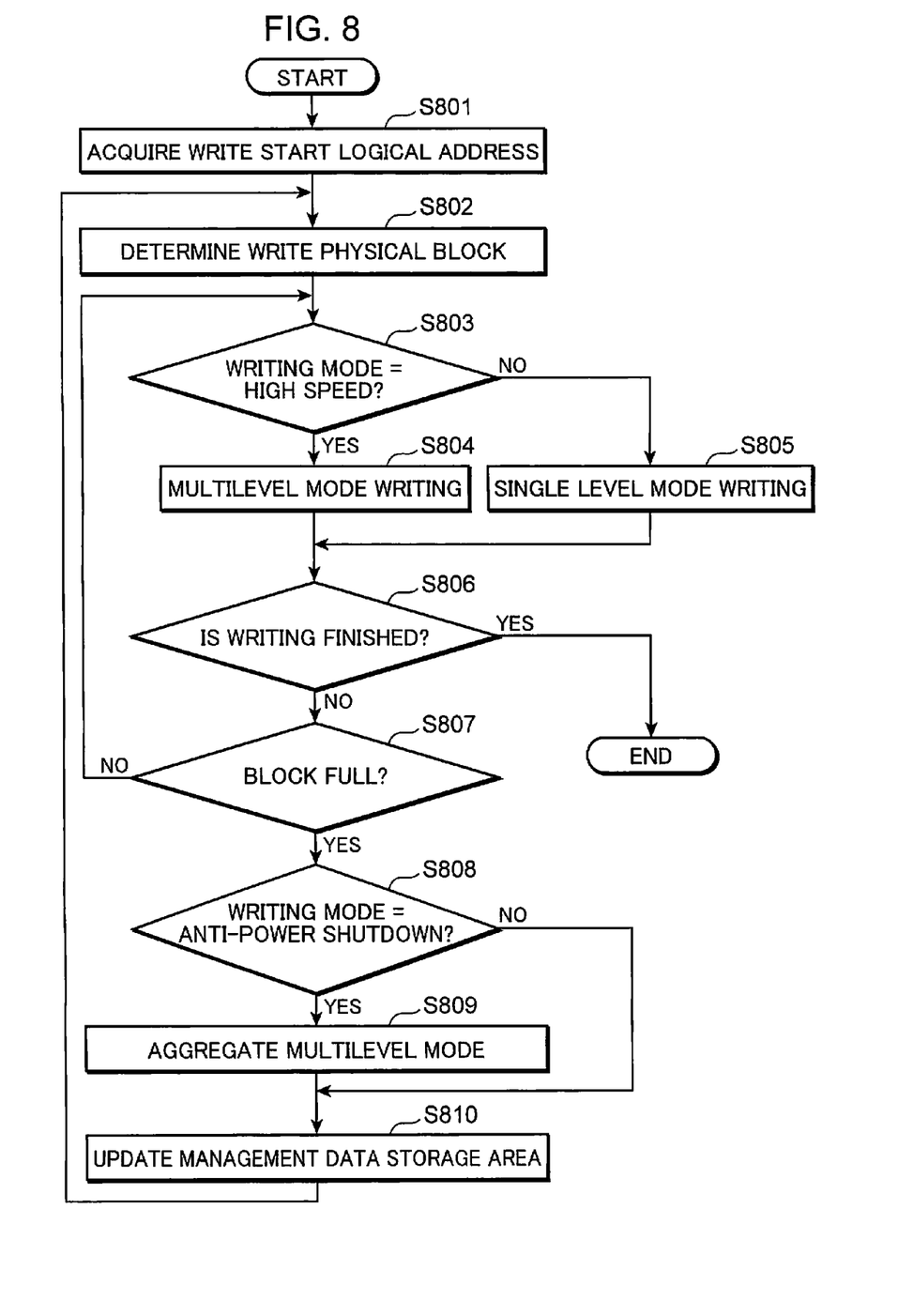
FIG. 8 is a flowchart explaining an example of the writing operation of the nonvolatile memory device shown in FIG. 1.

FIG. 8 is a flowchart explaining an example of the writing operation of the nonvolatile memory device 102 when the command unit 101 of the access device 100 sends a write command, write logical address and write data to the nonvolatile memory device 102.

Foremost, the host interface 105 of the memory controller 103 receives a write command from the command unit 101 of the access device 100, acquires the write logical address and write data designated by the command unit 101 of the access device 100, and notifies the write logical address and the like to the reading/writing control unit 110 (S801).

Subsequently, the reading/writing control unit 110 converts the write logical address into a logical address in logical block units and acquires the logical address of the logical block to which writing is to be started, and thereafter determines the write physical block to which writing is to be performed by referring to the logical/physical conversion table 106 and the like (S802).

Specifically, if the logical address of the logical block to which writing is to be started is registered in the mid-writing block management table 402 of the logical/physical conversion table 106, the reading/writing control unit 110 determines the physical block corresponding to that logical block as the write physical block.

Meanwhile, if the logical address of the logical block to which writing is to be started is not registered in the mid-writing block management table 402 of the logical/physical conversion table 106, the reading/writing control unit 110 uses the unused block management table 107 to acquire the physical address of the unused block, and erases that unused block. Subsequently, the reading/writing control unit 110 registers the physical address of the acquired physical block in the mid-writing block management table 402, and determines that physical block as the write physical block.

Subsequently, the reading/writing control unit 110 refers to the writing mode table 108 and determines whether the writing mode is set to the high-speed mode (S803). If the writing mode is set to the high-speed mode (if the determination is YES), the reading/writing control unit 110 writes data in the write physical block based on multilevel mode writing (S804). If the writing mode is set to the anti-power shutdown mode and not to the high-speed mode (if the determination is NO), the reading/writing control unit 110 writes data in the write block based on single level mode writing (S805).

Subsequently, the reading/writing control unit 110 determines whether the writing of all data sent from the access device 100 is finished (S806). If the writing of all data is complete (if the determination is YES), the reading/writing control unit 110 ends the data writing.

If the writing of all data is not complete (if the determination is NO), the reading/writing control unit 110 confirms whether the writing of data in all write target pages of the write physical block is complete (S807). If the writing of data in all write target pages of the write physical block is complete (if the determination is NO), the reading/writing control unit 110 returns to processing S803 and performs unfinished data writing.

If the writing of data in all write target pages of the write physical block is complete (if the determination is YES), the reading/writing control unit 110 determines whether the writing mode is set to the anti-power shutdown mode (S808).

If the writing mode is set to the anti-power shutdown mode (if the determination is YES), the reading/writing control unit 110 implements multilevel mode aggregation (S809). Specifically, when data is written in all pages of the write block, the reading/writing control unit 110 performs aggregation processing of copying data of the writing completed block and data of the write block with a common logical address to an unused block based on multilevel mode writing. Meanwhile, if the writing mode is set to the high-speed mode and not to the anti-power shutdown mode (if the determination is NO), the reading/writing control unit 110 performs processing S810 explained below.

The reading/writing control unit 110 thereafter registers the physical address of the created writing completed block in the writing completed block management table 401 of the logical/physical conversion table 106, and deletes it from the mid-writing block management table 402.

Here, the reading/writing control unit 110 changes the status in the unused block management table 113 of the physical block, which was registered in the writing completed block management table 401, in relation to the physical address to "unused," and changes the status in the unused block management table 107 of the physical block, which was newly registered, in relation to the physical address to "in use."

Subsequently, the reading/writing control unit 110 writes the changed logical/physical conversion table 106 and the unused block management table 113 in the management data storage area 111 of the nonvolatile memory 104 (S810), and returns to the write physical block determination processing S802.

Based on the foregoing processing, in this embodiment, data sent from the access device 100 can be written into the nonvolatile memory 104 at a high speed based on multilevel mode writing in cases where the writing mode is set to the high-speed mode, and data sent from the access device 100 can be written into the nonvolatile memory 104 based on single level mode writing and multilevel mode aggregation in cases where the writing mode is set to the anti-power shutdown mode, and it is thereby possible to prevent the data corruption caused by a power shutdown.

[Writing Mode Change Routine]

Figure 9:
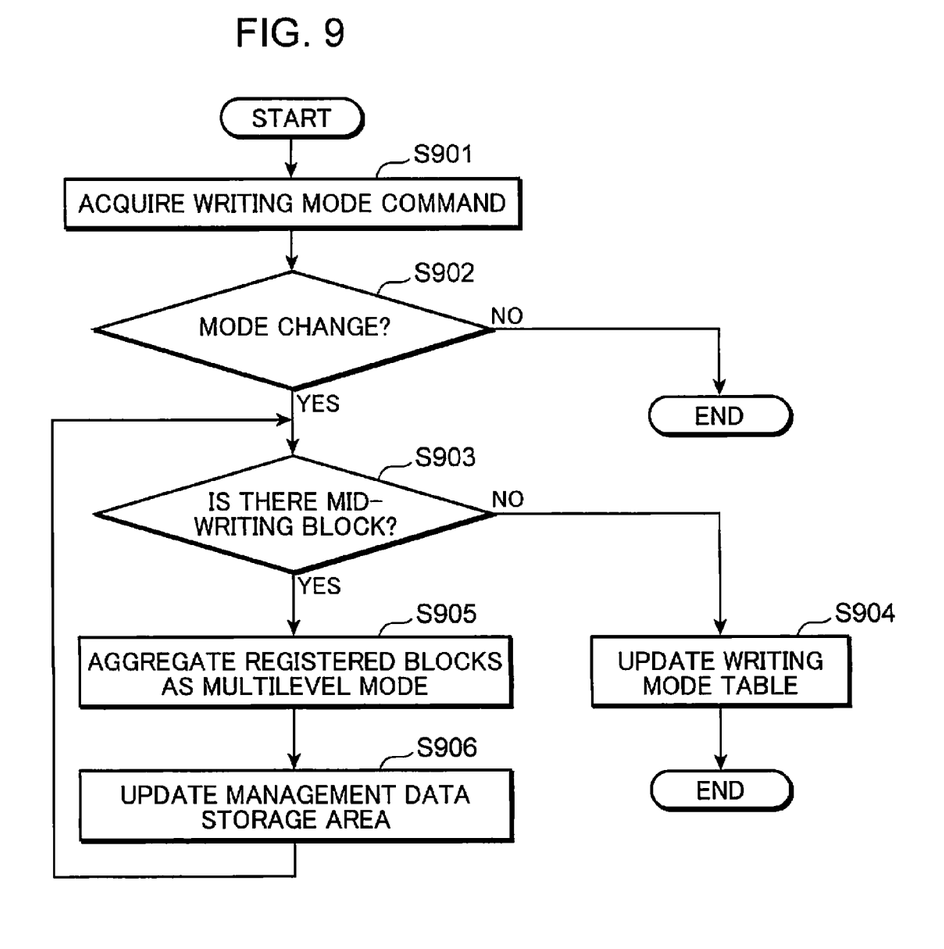
FIG. 9 is a flowchart explaining an example of the writing mode change processing of the nonvolatile memory device shown in FIG. 1.

FIG. 9 is a flowchart explaining an example of the writing mode change processing of the nonvolatile memory device 102 when the command unit 101 of the access device 100 sends a writing mode change command and a new writing mode to the nonvolatile memory device 102.

When the command unit 101 sends to the nonvolatile memory device 102 a writing mode change command and a new writing mode representing the writing mode to be changed based on that command, foremost, the host interface 105 of the memory controller 103 acquires the new writing mode designated by the command unit 101 of the access device 100, and notifies the writing mode change control unit 109 (S901).

The writing mode change control unit 109 acquires the current writing mode from the writing mode table 108, and compares it with the new writing mode to determine whether they coincide (S902). If the two writing modes coincide (if the determination is NO), the writing mode change control unit 109 ends the writing mode change processing since there is no need for a mode change.

If the two writing modes do not coincide (if the determination is YES), since this means that the writing mode has been converted, the writing mode change control unit 109 proceeds with the processing and refers to the mid-writing block management table 402 of the logical/physical conversion table 106, and confirms whether there is a mid-writing block (S903).

If there is no mid-writing block (if the determination is NO), the writing mode change control unit 109 updates the writing of the writing mode table 108 to the new writing mode (S904), and ends the writing mode change processing.

If there is a mid-writing block (if the determination is YES), the writing mode change control unit 109 notifies the determination result to the reading/writing control unit 110, and the reading/writing control unit 110 implements multilevel mode aggregation to one mid-writing block that is registered (S905). Here, the reading/writing control unit 110 implements the multilevel mode aggregation regardless of whether the mid-writing block has been written based on single level mode writing or written based on multilevel mode writing. Accordingly, if a power shutdown occurs during the writing mode change processing, data corruption caused by the power shutdown can be prevented by abandoning the data written in the writing completed block that is being created when the power is restored.

The reading/writing control unit 110 thereafter implements the same management data storage area processing as processing S810 (S906), and returns to processing S903.

Based on the foregoing processing, the new writing mode sent from the access device 100 can be set in the writing mode table 108.

As described above, according to this embodiment, the nonvolatile memory device 102 comprises the writing mode table 108 and enables the change of the writing mode from the access device 100, and the writing method can be switched between the high-speed mode and the anti-power shutdown mode according to the writing circumstances. As a result of switching the writing method as described above, for example, the writing time of data can be shortened in cases where there is no possibility of an abnormal power shutdown such as during factory production since high-speed writing based on the high-speed mode is enabled.

Note that, although this embodiment was explained as described above, the present invention is not limited to this embodiment. The present invention can be variously modified to the extent that it does not deviate from the gist hereof. For example, the following cases are also covered by the present invention.

(1) A NAND-type flash memory using a memory cell capable of recording 2-bit data was used as the nonvolatile memory 104 of this embodiment. However, without limitation to 2-bit data, similar effects as those described above can be obtained with a nonvolatile memory using a memory cell capable of recording multiple-bit (for example, 3-bit or 4-bit) data.

(2) In this embodiment, whether to perform "single level mode writing" or "multilevel mode writing" was determined based on the writing mode (high-speed mode or anti-power shutdown mode) stored in the writing mode table 108. However, there is no need to apply the foregoing determination result to the entire area of the data storage area 112, and the writing mode of areas that are not subject to contents data writing may be selected without depending on the writing mode stored in the writing mode table 108.

For example, the data storage area 112 can be divided into a mode changeable area where the writing mode can be changed, and a mode unchangeable area where the writing mode cannot be changed, and data can be written only in the mode changeable area according to the writing mode stored in the writing mode table 108.

Moreover, with a mode unchangeable area, preferably, writing is performed only with a pre-set writing mode and change of the writing mode from the outside is prevented. For example, by setting the writing mode of the mode unchangeable area to the anti-power shutdown mode in advance and writing important data such as file system data in the mode unchangeable area, the corruption of important data caused by a power shutdown can be reliably prevented.

(3) In this embodiment, a case was explained of performing the data writing of the anti-power shutdown mode in two steps; namely, single level mode writing and multilevel mode aggregation. However, writing may be performed according to other methods so as long as it is a data writing method capable of preventing the corruption of data caused by a power shutdown.

For example, adopted may be a writing method of duplicating and storing data by writing the same data in a physical page of another physical block upon writing data in a physical page of a mid-writing block. Here, if data of a mid-writing block is corrupted due to a power shutdown, data corruption caused by a power shutdown can be prevent by reading data from the other physical page that was duplicated.

Moreover, adopted may be a writing method of reading data that would be corrupted due to a power shutdown and backing up such data to a physical page of another physical block upon writing data in a physical page of a mid-writing block, and writing data in the physical page of the mid-writing block after performing the backup. Here, if data of the mid-writing block is corrupted due to a power shutdown, the corruption of data can be prevented by reading the backup data.

Similar effects as those described above can be obtained even in cases of using the foregoing writing methods.

(4) In this embodiment, multilevel mode aggregation is implemented to a mid-writing block when the access device 100 sends a write mode change command to the nonvolatile memory device 102. However, the multilevel mode aggregation may also be implemented when the subsequent write command is sent, and not when the writing mode change command is sent.

For example, the mid-writing block management table 402 may record, in addition to correspondence information of a physical address and a logical address, information showing whether data written in the mid-writing block has been written based on "single level mode writing" or "multilevel mode writing" as an existing data writing method. Here, the reading/writing control unit 110 may refer to the mid-writing block management table 402 and the writing mode table 108 upon receiving the write command, and, if the existing data writing method of the mid-writing block determined based on the mid-writing block management table 402 is different from the writing method determined based on the writing mode of the writing mode table 108, the reading/writing control unit 110 may perform multilevel mode aggregation of copying data of the writing completed block and data of the mid-writing block, to the unused block based on multilevel mode writing.

As described above, the method of performing multilevel mode aggregation when a write command is sent is effective in reducing the number of times the physical pages need to be copied pursuant to the writing mode change and shortening the writing mode change time in cases where the writing mode is changed a plurality of times.

The following is a summary of the present invention based on each of the embodiments described above. Specifically, the nonvolatile storage device according to the present invention is a nonvolatile storage device which is capable of communicating with an access device and performs writing and reading of data based on commands from the access device, comprising a nonvolatile memory in which the writing and reading of data are performed based on a physical address corresponding to a logical address and which is capable of multilevel writing, and a memory controller for controlling writing operation and reading operation of the nonvolatile memory, wherein the nonvolatile memory includes a plurality of blocks serving as an erase unit, each of the plurality of blocks includes a plurality of pages serving as a write unit, wherein the memory controller includes a logical/physical conversion table storing correspondence information of a logical address and a physical address of data stored in the blocks, a control unit for specifying the physical address from the logical/physical conversion table based on the logical address received from the access device, and controlling the writing and reading of data to and from the blocks of the nonvolatile memory, a writing mode table for storing one of a first writing mode of protecting data against a power shutdown during writing and a second writing mode of writing data at a higher speed than the first writing mode, and a setting unit for setting the first writing mode or the second writing mode received from the access device in the writing mode table, and wherein the control unit performs data writing based on the writing mode that has been set in the writing mode table.

With this nonvolatile storage device, since the first writing mode or the second writing mode received from the access device is set in the writing mode table for storing one of the first writing mode of protecting data against a power shutdown during writing and the second writing mode of writing data at a higher speed than the first writing mode, and data writing is performed based on the writing mode that has been set in the writing mode table, when performing data writing to the nonvolatile storage device, the writing time of the contents data can be shortened by using the second writing mode for realizing high-speed data writing separate from the first writing mode performed against the power shutdown.

Preferably, if the first writing mode is set in the writing mode table, the control unit performs single level mode writing to the physical address specified from the logical/physical conversion table, and thereafter copies data of a plurality of blocks with data written therein corresponding to the logical address designated from the access device, to an unused block with no data written therein based on multilevel writing, and, if the second writing mode is set in the writing mode table, the control unit performs multilevel mode writing to the physical address specified from the logical/physical conversion table.

In the foregoing case, if the first writing mode is set, since data of a plurality of blocks with data written therein is copied to an unused block with no data written therein based on multilevel writing after performing single level mode writing, it is possible to prevent the corruption of data caused by a power shutdown, and, if the second writing mode is set, since the multilevel mode writing is performed, the writing time of contents data can be shortened in cases where there is no possibility of an abnormal power shutdown such as during factory production.

Preferably, the blocks of the nonvolatile memory include a writing completed block in which data is written in all pages within the block in accordance with the logical address designated by the access device, a write block to which data corresponding to the logical address designated by the access device is to be written, and an unused block in which data has been erased, and, if the first writing mode is set in the writing mode table, the control unit constantly writes data into the write block based on the single level mode writing, and, when data is written in all pages of the write block, performs aggregation processing of copying data of the writing completed block and data of the write block with a common logical address, to the unused block based on multilevel mode writing.

In the foregoing case, if the first writing mode is set, since data is constantly written into the write block based on the single level mode writing, and, after data is written in all pages of the write block, data of the writing completed block and data of the write block with a common logical address is copied to the unused block based on multilevel mode writing, even if a power shutdown occurs during the aggregation processing based on the multilevel mode writing, it is possible to perform aggregation processing once again when the power is restored by abandoning the data that has been written into the writing completed block in the midst of being created based on the aggregation processing, and using data of the writing completed block and data of the write block before the aggregation processing was performed, and it is possible to reliably prevent the corruption of data caused by a power shutdown.

Preferably, when the control unit receives a new writing mode from the access device and if the new writing mode is different from the writing modes stored in the writing mode table, the control unit performs aggregation processing of copying data of the writing completed block and data of the write block, to the unused block based on multilevel mode writing.

In the foregoing case, when a new writing mode is received from the access device and if the new writing mode is different from the writing modes stored in the writing mode table, since data of the writing completed block and data of the write block is copied to the unused block based on multilevel mode writing, the foregoing aggregation processing is performed in cases where the mid-writing block has been written based on the single level mode writing and in cases where the mid-writing block has been written based on the multilevel mode writing, and, therefore, even if the power is shut down while the writing mode is being changed, data that has been written into the writing completed block in the midst of being created based on the aggregation processing is abandoned, and it is possible to prevent the corruption of data caused by a power shutdown during the change of the writing mode.

The logical/physical conversion table may include a mid-writing block management table which records, in addition to correspondence information of a physical address and a logical address of a mid-writing block being a block in which data is not written in all pages within the block, information showing whether data written in the mid-writing block has been written based on single level mode writing or multilevel mode writing as an existing data writing method, and, when the control unit receives a write command from the access device and if the existing data writing method of the mid-writing block determined based on the mid-writing block management table is different from a writing method determined based on the writing mode of the writing mode table, the control unit may perform aggregation processing of copying data of the writing completed block and data of the write block, to the unused block based on multilevel mode writing.

In the foregoing case, when a write command is received from the access device and if the existing data writing method of the mid-writing block determined based on the mid-writing block management table is different from a writing method determined based on the writing mode of the writing mode table, since the aggregation processing of copying data of the writing completed block and data of the write block, to the unused block based on multilevel mode writing is performed, it is possible to reduce the number of times that copying is performed pursuant to the change of the writing mode if the writing mode is to be changed several times, and the time required for changing the writing mode can thereby be shortened.

Preferably, the blocks of the nonvolatile memory include a writing completed block in which data is written in all pages within the block in accordance with the logical address designated by the access device, a write block to which data corresponding to the logical address designated by the access device is to be written, and an unused block in which data has been erased, and, if the first writing mode is set in the writing mode table, the control unit backs up data to another block prior to writing that data in the write block, and writes the data in the write block after performing the backup.

In the foregoing case, if the first writing mode is set in the writing mode table, since data is backed up in another block prior to writing that data in the write block, and data is written in the write block after performing the backup, even if data of the mid-writing block is corrupted due to a power shutdown, the corruption of data can be prevented by reading the backup data.

Preferably, the nonvolatile memory includes a mode changeable area where the writing mode can be changed, and a mode unchangeable area where the writing mode cannot be changed, and the control unit writes data only in the mode changeable area according to the writing modes stored in the writing mode table.

In the foregoing case, since data is written only in the mode changeable area according to the writing mode stored in the writing mode table, the foregoing effects are yielded in the mode changeable area, and, by setting the writing mode of the mode unchangeable area as the first writing mode in advance and writing important data such as file system data in the mode unchangeable area, the corruption of important data caused by a power shutdown can be reliably prevented.

The access device according to the present invention is an access device which is capable of communicating with a nonvolatile storage device and performs data writing to the nonvolatile storage device and data reading from the nonvolatile storage device, wherein the access device instructs the nonvolatile storage device of either a first writing mode of protecting data against a power shutdown during writing or a second writing mode of writing data at a higher speed than the first writing mode.

Since this access device instructs the nonvolatile storage device of either a first writing mode of protecting data against a power shutdown during writing or a second writing mode of writing data at a higher speed than the first writing mode, the nonvolatile storage device can perform data writing based on the instructed writing mode, the writing time of the contents data can be shortened by using the second writing mode for realizing high-speed data writing separate from the first writing mode performed against the power shutdown.

The nonvolatile storage system according to the present invention comprises any one of the foregoing nonvolatile storage devices, and the foregoing access device.

Since the present invention has a writing mode for realizing high-speed data writing separate from the writing mode performed against the power shutdown upon performing data writing to the nonvolatile storage device and can shorten the writing time of contents data, the present invention can be suitably applied to data writing to be performed to a nonvolatile storage device using a nonvolatile semiconductor memory; particularly to data writing to be performed to a multilevel flash memory.

This application is based on Japanese patent application serial no. 2010-055738, filed in Japan Patent Office on Mar. 12, 2010, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:
1. A nonvolatile storage device which is capable of communicating with an access device and performs writing and reading of data based on commands from the access device, comprising:
    a nonvolatile memory in which the writing and reading of data are performed based on a physical address corresponding to a logical address and which is capable of multilevel writing; and
    a memory controller for controlling writing operation and reading operation of the nonvolatile memory,
    wherein the nonvolatile memory includes a plurality of blocks serving as an erase unit,
    each of the plurality of blocks includes a plurality of pages serving as a write unit, and
    each of the plurality of pages belongs to a first cell page or a second cell page, the first cell page and the second cell page sharing a memory cell of the nonvolatile memory,
    the memory controller includes:
    a conversion table storing correspondence information of a logical address and a physical address of data stored in the blocks;
    a control unit for specifying the physical address from the conversion table based on the logical address received from the access device, and controlling the writing and reading of data to and from the blocks of the nonvolatile memory;
    a writing mode table for storing one of a first writing mode of protecting data against a power shutdown during writing and a second writing mode of writing data at a higher speed than the first writing mode; and
    a setting unit for setting the first writing mode or the second writing mode received from the access device in the writing mode table, and wherein the control unit performs data writing based on the writing mode that has been set in the writing mode table, wherein, if the first writing mode is set in the writing mode table, the control unit performs single level mode writing only in the pages belonging to the first cell page within the block with the physical address specified from the conversion table, and thereafter performs aggregation processing of copying data of a plurality of blocks with data written therein corresponding to the logical address designated from the access device, to an unused block with no data written therein based on multilevel writing, and if a power shutdown occurs during the aggregation processing, the control unit protects data against the power shutdown by abandoning the data written in the block during the aggregation processing when the power is restored and if the second writing mode is set in the writing mode table, the control unit performs multilevel mode writing to the physical address specified from the conversion table.

2. The nonvolatile storage device according to claim 1, wherein the blocks of the nonvolatile memory include:

a writing completed block in which data is written in all pages within the block in accordance with the logical address designated by the access device;

a write block to which data corresponding to the logical address designated by the access device is to be written; and an unused block in which data has been erased, and wherein, if the first writing mode is set in the writing mode table, the control unit constantly writes data into the write block based on the single level mode writing, and, when data is written in all pages of the write block, performs aggregation processing of copying data of the writing completed block and data of the write block with a common logical address, to the unused block based on multilevel mode writing.

3. The nonvolatile storage device according to claim 2, wherein, when the control unit receives a new writing mode from the access device and if the new writing mode is different from the writing modes stored in the writing mode table, the control unit performs aggregation processing of copying data of the writing completed block and data of the write block, to the unused block based on multilevel mode writing.

4. The nonvolatile storage device according to claim 2, wherein the conversion table includes a mid-writing block management table which records, in addition to correspondence information of a physical address and a logical address of a mid-writing block being a block in which data is not written in all pages within the block, information showing whether data written in the mid-writing block has been written based on single level mode writing or multilevel mode writing as an existing data writing method, and when the control unit receives a write command from the access device and if the existing data writing method of the mid-writing block determined based on the mid-writing block management table is different from a writing method determined based on the writing mode of the writing mode table, the control unit performs aggregation processing of copying data of the writing completed block and data of the write block, to the unused block based on multilevel mode writing.

5. The nonvolatile storage device according to claim 1, wherein the blocks of the nonvolatile memory include:

a writing completed block in which data is written in all pages within the block in accordance with the logical address designated by the access device;

a write block to which data corresponding to the logical address designated by the access device is to be written; and an unused block in which data has been erased, and wherein, if the first writing mode is set in the writing mode table, the control unit backs up data to another block prior to writing that data in the write block, and writes the data in the write block after performing the backup.

6. The nonvolatile storage device according to claim 1, wherein the nonvolatile memory includes a mode changeable area where the writing mode can be changed, and a mode unchangeable area where the writing mode cannot be changed, and the control unit writes data only in the mode changeable area according to the writing modes stored in the writing mode table.

7. A nonvolatile storage system, comprising:

a nonvolatile storage device; and an access device which is capable of communicating with the nonvolatile storage device and performs data writing to the nonvolatile storage device and data reading from the nonvolatile storage device, the nonvolatile storage device, comprising:

a nonvolatile memory in which the writing and reading of data are performed based on a physical address corresponding to a logical address and which is capable of multilevel writing; and a memory controller for controlling writing operation and reading operation of the nonvolatile memory, wherein the nonvolatile memory includes a plurality of blocks serving as an erase unit, each of the plurality of blocks includes a plurality of pages serving as a write unit, and each of the plurality of pages belongs to a first cell page or a second cell page, the first cell page and the second cell page sharing a memory cell of the nonvolatile memory, the memory controller includes:

a conversion table storing correspondence information of a logical address and a physical address of data stored in the blocks;

a control unit for specifying the physical address from the conversion table based on the logical address received from the access device, and controlling the writing and reading of data to and from the blocks of the nonvolatile memory;

a writing mode table for storing one of a first writing mode of protecting data against a power shutdown during writing and a second writing mode of writing data at a higher speed than the first writing mode; and a setting unit for setting the first writing mode or the second writing mode received from the access device in the writing mode table, and wherein the control unit performs data writing based on the writing mode that has been set in the writing mode table, and the access device instructs the nonvolatile storage device of either the first writing mode or the second writing mode, wherein, if the first writing mode is set in the writing mode table, the control unit performs single level mode writing only in the pages belonging to the first cell page within the block with the physical address specified from the conversion table, and thereafter performs aggregation processing of copying data of a plurality of blocks with data written therein correspond to the logical address designated from the access device, to an unused block with no data written therein based on multilevel writing, and if a power shutdown occurs during the aggregation processing, the control unit protects data against the power shutdown by abandoning the data written in the block during the aggregation processing when the power is restored and if the second writing mode is set in the writing mode table, the control unit performs multilevel mode writing to the physical address specified from the conversion table.

* * * * *